United States Patent [19]

Tamaki

[11] Patent Number: 4,607,166

[45] Date of Patent: Aug. 19, 1986

[54] MEANS FOR LOCATING AN ULTRA-PRECISION POSITIONING OF A TABLE

[75] Inventor: Akira Tamaki, Maebashi, Japan

[73] Assignee: Nippon Seiko Kabushiki Kaisha, Tokyo, Japan

[21] Appl. No.: 804,065

[22] Filed: Dec. 3, 1985

Related U.S. Application Data

[63] Continuation of Ser. No. 682,055, Dec. 14, 1984.

[30] Foreign Application Priority Data

Jan. 18, 1984 [JP] Japan ................................ 59-4184

[51] Int. Cl.⁴ .............................................. G21K 5/10
[52] U.S. Cl. .................................. 250/442.1; 310/328
[58] Field of Search ..................... 250/440.1, 442.1; 310/328, 348; 269/58, 60

[56] References Cited

U.S. PATENT DOCUMENTS

| | | | |
|---|---|---|---|
| 3,684,904 | 8/1972 | Galutua et al. | 250/442.1 |
| 3,835,338 | 9/1974 | Martin | 310/328 |
| 3,902,085 | 8/1975 | Bizzigotic | 310/328 |
| 4,447,731 | 5/1984 | Kumi et al. | 250/442.1 |
| 4,506,154 | 3/1985 | Scire | 250/442.1 |

*Primary Examiner*—Bruce C. Anderson
*Attorney, Agent, or Firm*—Kramer and Brufsky

[57] ABSTRACT

This invention relates to means for locating an ultra-precision positioning of a table, in which a rough moving of the table is made by a motor connected to the aforesaid means, while a minute moving thereof is done by a piezo-electric element mounted on a ball screw shaft to be driven by the motor, whereby an ultra-precision positioning of the table can be carried out smoothly. Accordingly, it is unnecessary to dispose a roughly moving table and a minutely moving table separately within a device.

3 Claims, 7 Drawing Figures

Prior Art

MEANS FOR LOCATING AN ULTRA-PRECISION POSITIONING OF A TABLE

This is a continuation of Ser. No. 682,055 filed on Dec. 14, 1984.

BACKGROUND OF THE INVENTION

1. Field of the Invention:

This invention relates to means for locating an ultra-precision position of a table particularly for a mask pattern exposure.

2. Prior Art:

In recent years, techniques for producing integrated circuits are being developed with a rapid speed. Among others, a mask pattern exposure device by reduced projection, an electronic linear describer or the like is used, in which a X-Y moving table is an essential means for feeding wafers intermittently. The accuracy and moving time for locating the position of such X-Y moving table become indispensable factors for throughput of the device itself.

Conventionally, there is for example a X-Y moving means (shown in FIG. 1A), on which a table for minute moving exclusively is mounted, and its precise positioning is made by a piezoelectric element actuator. Such X-Y moving means is disclosed in the Scientific Symposium of the 1983 Spring Convention of Japan Society of Precision Engineering, and was manufactured as a test device by the Central Laboratory of Hitachi, Ltd. of Japan.

The aforesaid X-Y moving means comprises a double X-Y moving table 1 of a sliding guide construction and a pair of driving means 2 fixed on a base 3, the pair of driving means 2 being arranged on a X-axis and a Y-axis respectively.

The moving table 1 comprises a X-Y roughly moving table 4 (120 mm × 120 mm) for a rough positioning of 5 μm accuracy and a minutely moving table 5 mounted on the roughly moving table 4. A lower end of a cross-type X moving member 6 is guided by a X-axis guide groove 7 recessed in a center portion of the base 3, while an upper end thereof is connected to a Y-axis guide member 8, and the latter is moved in a X-axis direction. The X-Y roughly moving table 4 is mounted upon the X moving member 6, and moved slidably in both a X and Y directions on an upper surface of the base 3, while being supported by the guide member 8 as well as by four PTFE (polytetrafluoroethylene) sliding members 9 (containing glass fibers) disposed at four corners. For example, the PTFE commercially called "RULON A" may be used. All sliding portions are bonded by a PTFE sheet (not illustrated).

The minutely moving table 5 is supported on the roughly moving table 4 by four resilient bars 10 each having arcuately cutaway portion 10a at both ends, and driven by three cylindrical piezoelectric element actuators 11 incorporated between the both tables 4 and 5. Each piezoelectric element actuator 11 has a circulately cutaway resilient and deformable element 11a or an output terminal at its both ends. Under an application of 600 V, the piezoelectric element actuator 11 shows displacement of 18 μm. Sealed in a gap of 100 μm between the both tables 4 and 5 is a high viscosity silicone oil 12, thereby a damping function is available.

FIG. 2 shows a plane arrangement of the three piezoelectric element actuators $11x$, $11y1$ and $11y2$. By varying the length of each piezoelectric element actuator, the minutely moving table 5 is moved in each direction of $XY\theta$, and the minutely moving table 5 indicates a displacement 13 as shown by moved values $\Delta x$, $\Delta y$, and $\Delta y2$. Since each piezoelectric element actuator is, at its respective end, provided with the resilient and deformable output terminal 11a which is a rotating point, it has a parallel moving and sliding function. The maximum movable range of the minutely moving table 5 is ±8 μm in both X and Y directions, and its $\theta$ rotation is ±160 μrad.

Each driving means 2 comprises a DC servo motor 21 (hereinafter called "Motor") and a ball screw shaft 22. The driving means 2 disposed in a X-axis direction is connected to the X moving member 6, while the other driving means disposed in a Y-axis direction comprises further a Y-axis driving member 25 to be guided linearly by a roller guide 24. The Y-axis driving member 25 is linked with the minutely moving table 5 by way of a pair of rollers 26, 26, between which a rail 25a is disposed.

The positioning control of the roughly moving table 4 as well as of the minutely moving table 5 is made in a closed loop form by a laser interferometer (not illustrated), and there is adopted a dual mode control system for switching a speed control and a position control in accordance with a position deflection from a target value.

The X moving member 6 is moved with a high speed of 100 mm per second after starting. After a smooth speed reduction has been made along with a suitable speed reduction curve, a linear position control is carried out. The table speed signal is outputted by a tachogenerator 27 directly connected to the motor shaft, and switching of the control mode is made by selecting a suitable gain constant of the speed signals and of the position deflection signal.

On a Y-axis where a back-lash exists, after the motor speed has been reduced smoothly, the tachogenerator is run with a constant speed of 1 mm per second, and a pulse inverting signal is applied to the motor 21 at a distance of 1 μm before the target value. Thus, as soon as the table stops movement, a back-lash of about 30 μm is prepared.

Although the position control of the minutely moving table 5 is initiated at the time when the rough positioning has been ended, its yawing control is constantly corrected by the DC servo motor 21.

However, on the X-Y moving table 1 the Y roughly moving table and the X minutely moving table are separated from each other, so that a suitable parallel degree and a suitable right angle degree toward a mutual movement of each table are not given easily. Further, when the minutely moving table 5 is placed on the X-Y roughly moving table 4, the former may be affected by pitching, yawing or the like of the latter that is disposed immediately under the former.

As shown in FIGS. 1A and 1B, the tables 4 and 5 are supported by the four resilient bars 10. If the resilience of each bar 10 is not constant, the upper table 5 may be inclined.

As shown in FIG. 1B, each piezoelectric element actuator is mounted between the both tables 4, 5 fixed with each other, and one end of the piezoelectric element actuator is supported rotatably by the table 4, while the other end thereof is supported rotatably by the table 5. In this case, there is the danger that hysteresis may arise by friction resistance.

There is also known a device in which a X-Y moving table is moved by only piezoelectric element actuators.

However, its movable range is extremely limited, and a high speed movement of the table is difficult.

BRIEF SUMMARY OF THE INVENTION

It is therefore a general object of this invention to provide means for locating an ultra-precision positioning of a table, in which a rough moving of the table is made by a motor connected to the aforesaid means, while a minute moving thereof is done by a piezoelectric element mounted on a ball screw shaft to be driven by the motor, whereby an ultra-precision positioning of the table can be carried out smoothly. Accordingly, it is unnecessary to dispose a roughly moving table and a minutely moving table separately within one unit of a device.

Other objects and advantages of this invention will become apparent from the following description taken in connection with the accompanying drawings.

PREFERRED EXAMPLES OF THE INVENTION

Figure 1A:
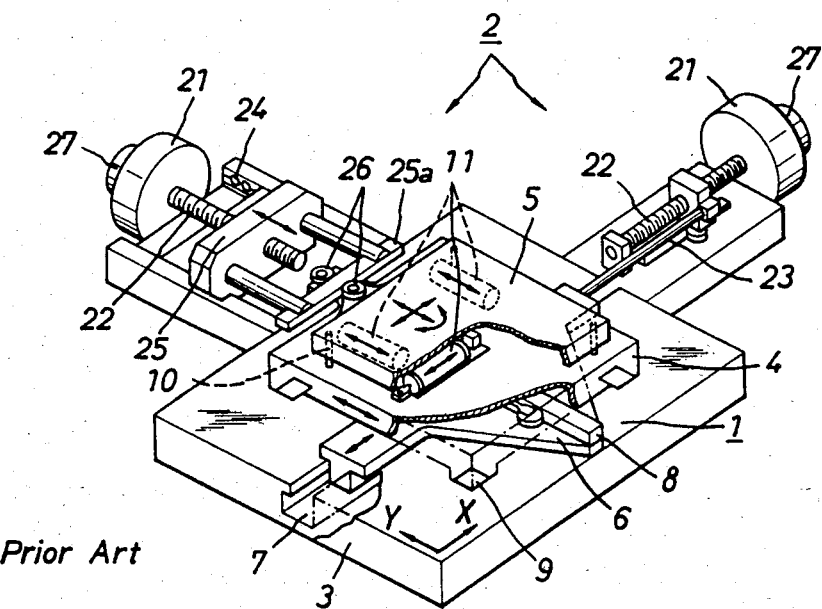
FIG. 1A is a perspective view of a conventional X-Y moving means.
Figure 1B:
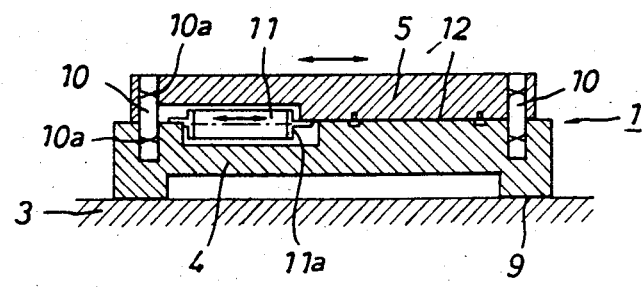
FIG. 1B is a section view of a combined condition of a roughly moving table and a minutely moving table in FIG. 1A.
Figure 2:
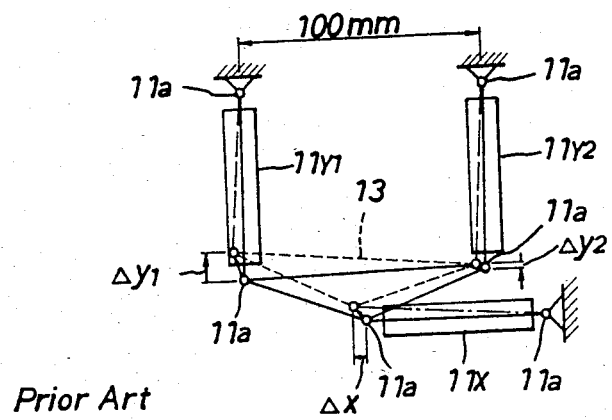
FIG. 2 is a plan view of X, Y, θ minutely moving condition by means of three piezoelectric element actuators in the X-Y moving means in FIG. 1A.
Figure 3:
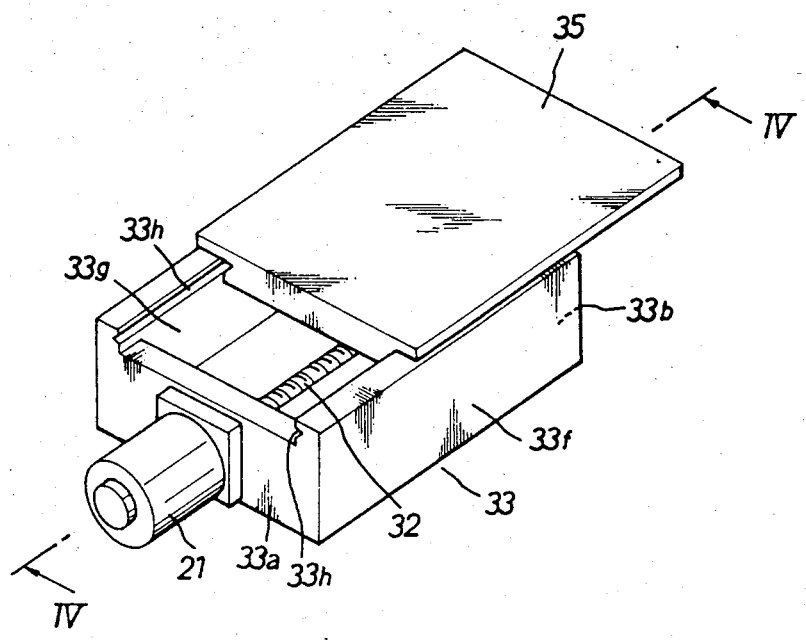
FIG. 3 is a perspective view of means for locating an ultra-precision positioning of a table.
Figure 4:
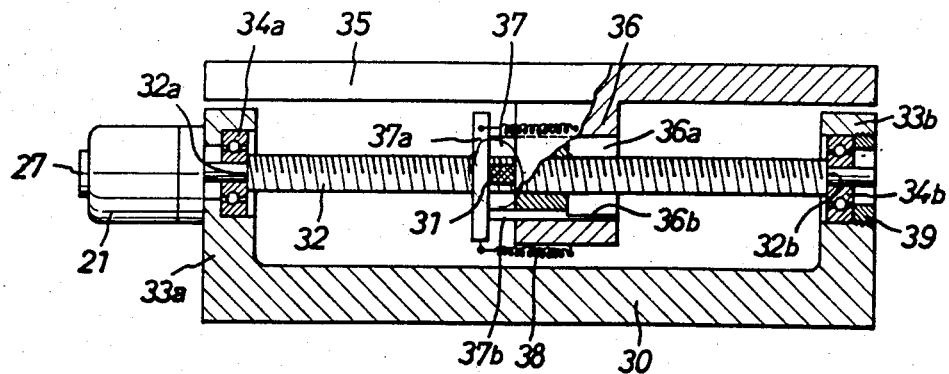
FIG. 4 is a section view taken on IV-IV line of FIG. 3.

A first example of this invention will now be described with reference to FIGS. 3 and 4.

Numeral 30 is a cramp-type case, in which a ball screw shaft 32 is incorporated, and its both ends 32a and 32b are fixed with two built-in bearings 34a and 34b in respective side walls 33a and 33b. The ball screw shaft 32 is connected directly to the motor 21 disposed outside the side wall 33a, and driven rotatably by it.

Numeral 35 is a movable table on which e.g. a wafer is mounted for a mask pattern exposure. As shown in FIG. 3, the table 35 is guided in an axial direction of the ball screw shaft 32 by a pair of cross roller guides 33h which are recessed in the interior of a front wall 33f and a rear wall 33g respectively. Roller bearings of the cross roller guides 33h are not illustrated.

The movable table 35 has a bracket 36 at its center portion, in which a passage 36a is formed. Numeral 37 is a cylindrical slidable ball nut which is incorporated in the passage 36a. The slidable ball nut 37 is, at its one end, provided with a flange 37a. The ball nut 37 is engaged with the ball screw shaft 32. Numeral 36b is a key groove formed on an inner surface of the passage 36a, and a key or stopper 37b is incorporated in the key groove 36b. Thus, the ball nut 37 is prevented from being rotated by the key 37b, but slidable in an axial direction.

The flange 37a is linked with the bracket 36 by way of a tension spring 38 which provides a prior pressure to a desired number of piezoelectric elements 31 disposed between the flange 37a and the tension spring 38.

Numeral 39 is a clamping nut, by which the end 32b of the ball screw shaft 32 is fixed forcibly with the built-in bearing 34b. Thus, the end 32a thereof is firmly fixed with the bearing 34a.

An operation of the device according to the first example will be described hereinafter.

When rotating the ball screw shaft 32 by driving the motor 21, the ball nut 37 engaged with the ball screw shaft 32 is prevented from being rotated by the key 37b, so that it is moved in an axial direction, thereby the bracket 36, namely the table 35 is moved and positioned roughly by the movement of the ball nut 37 and the tension spring 38. Accordingly, the ball screw shaft 32 driven by the motor 21 performs the function of a rough positioning of the table 35.

Following the above step, the position of the table 35 is detected by a laser interferometer (not illustrated).

Subsequently, since the piezoelectric element 31 is actuated or extended minutely by a preferred actuator (not illustrated), the bracket 36 is moved and an ultra-precision positioning of the table 35 can be defined. Accordingly, the piezoelectric element 31 performs the function of a minute positioning of the table 35.

Figure 5:
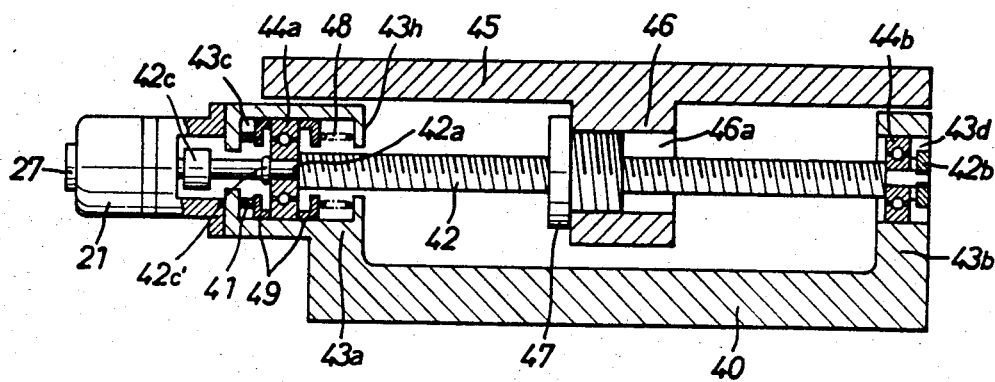
FIG. 5 is a section view of a second example of this invention.

A second example of this invention will now be described with reference to FIG. 5. The second example is characterized by that a piezoelectric element 41 is disposed in the proximity of the motor 21.

The motor 21 is mounted on a top of a cylindrical housing 43h associated with a side wall 43a of a case 40. Mounted in the cylindrical housing 43h is a built-in slidable bearing 44a, while mounted in a side wall 43b is also another built-in slidable bearing 44b. A ball screw shaft 42 supported by the bearing 44b is connected to the motor 21 by way of a coupling 42c, thereby enabling its axial rotation.

Numeral 48 is a spring which is disposed adjacent the bearing 44a. Numeral 42c' is a C-ring which is connected to an end 42a of the ball screw shaft 42. Numeral 49 is an outer ring. Under such a construction, the spring 48 applies a provisional pressure for the piezoelectric element 41. The built-in bearing 44b is fixed by a clamping nut 42b disposed in the side wall 43b.

The ball nut 47 is fixed with a bracket 46 of the table 45 by a bolt.

The operation of the second example will be described hereinafter.

When the ball screw shaft 42 is rotated by the motor 21, the table 45 is moved by the ball nut 47 integrally combined therewith, thereby a rough positioning of the table is defined. Subsequently, when the piezoelectric element 41 is actuated or extended minutely by a preferred actuator (not illustrated), the rings 49 and the bearing 44a are moved and the spring 48 is compressed accordingly. Subsequently, the ball screw shaft 42 is moved in an axial direction or in a right direction of FIG. 5, so that the table 45 is also moved minutely in the same direction. If the piezoelectric element 41 is shrinked, it permits the spring 48 to press on the rings 49, thereby the ball screw shaft 42 is withdrawn and the table 45 moves in a leftside direction. Thus, an ultra-precision positioning of the table 45 is defined.

Figure 6:
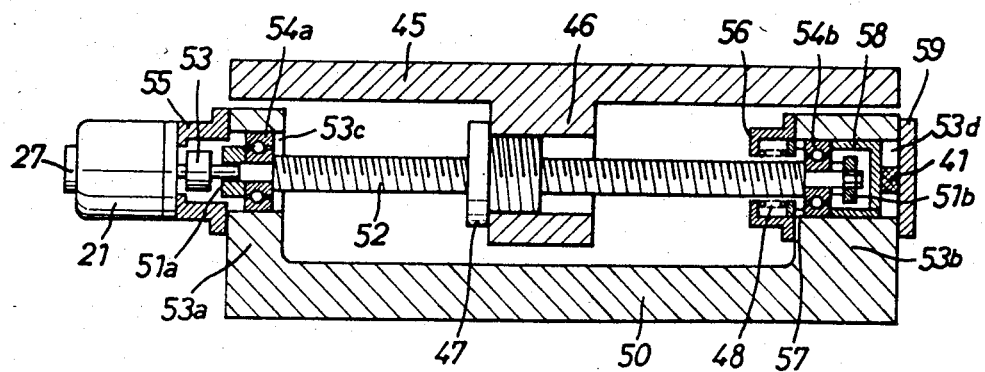
FIG. 6 is a section view of a third example of this invention.

A third example of this invention will be described with reference to FIG. 6.

The third example is characterized by that the piezoelectric element 41 is disposed at the furthermost distance from motor 21.

The motor 21 is fixed with a side wall 53a of a case 50 by way of a coupling housing 55. Mounted in a side wall 53a is a slidable bearing 54a, while mounted in the other side wall 53b is a slidable bearing 54b. The bearing 54a is fixed with a clamping nut 51a, while the second bearing 54b is fixed with a second clamping nut 51b. A ball screw shaft 52 is linked with the motor 21 by way of a coupling 53 and the ball nut is engaged with the ball screw shaft 52.

The spring 48 is disposed in a housing 56 adjacent the bearing 54b and applies a provisional pressure for the bearing 54b by way of a ring 57 as well as for the piezoelectric element 41 by way of a cylindrical housing 58 for covering the second clamping nut 51b. Numeral 59 is an outer cover member fixed with the piezoelectric element 41 as well as the side wall 53b.

Likewise in the second example, a rough positioning of the table 45 is defined by an axial rotation of the ball screw shaft 52 driven by the motor 21, while a minute positioning thereof is defined by the actuation of the piezoelectric element 41. Accordingly, since the operation of the second example is the same as that of the first one, its description will be omitted.

Means for supporting the table may be a plurality of rollers or a statically pressurized guide. If the statically pressurized guide by means of air will be used, a sliding resistance of the table becomes very little.

Although the ball screw shaft is used in each example, it may be replaced with other preferred means.

Still further, although the spring in each example is a coil one, it may be replaced with a plate spring, because the movement of the piezoelectric element is very minute.

As described previously, according to one aspect of this invention, a separate table exclusively for minute positioning is not necessary and omitted. Conventionally, since two tables i.e. a first table for rough positioning and a second table for minute positioning are disposed one above another, it is very cumbersome to maintain a parallel degree or a right angle level between the two tables. This invention has removed such disadvantage.

In this invention, the rough positioning of the table due to actuation of a motor and the minute positioning thereof due to actuation of a piezoelectric element are carried out on the same guide means, so that an ultra-precision positioning of the table can be done smoothly and speedily.

It is to be understood that the form of this invention herein shown and described is to be taken as a preferred example of the same and that various changes in the shape, size and arrangement of parts may be resorted to without departing from the spirit of this invention or the scope of the subjoined claims.

What is claimed is:

1. Means for locating an ultra-precision positioning of a table, comprising:
    a case body;
    a movable table disposed upon a top of said case body;
    a screw shaft means rotatable by a motor and supported by bearing means slidably supported on said case body, said screw shaft means being disposed in parallel with a moving direction of said table;
    a nut means engaged with said screw shaft means and supported by said table for axially roughly moving said table upon rotation of said screw shaft means; and
    a piezoelectric element on said case body between said bearing means and case body biased by a spring means which is extensible minutely in an axial direction relative to said table to impart fine movement to said table through axial movement or said nut means enabling an ultra-precision positioning of said table.

2. Means for locating an ultra-precision positioning of a table, comprising:
    a case body (40);
    movable table (45) disposed upon a top of said case body;
    a screw shaft means (42) rotatable by a motor (21) and supported by bearing means (44a);
    said screw shaft means being disposed in parallel with a moving direction of said table;
    a nut means engaged with said screw shaft means and supported by said table for axially roughly moving said table upon rotation of said screw shaft means;
    said bearing means (44a) being disposed in a housing (43h) associated with a side wall of said case body (40);
    a spring means (48) disposed in said housing and adjacent said bearing means;
    a piezoelectric element disposed between said bearing means and a side wall of said housing; and
    said piezoelectric element being pressed by said spring means which is extensible minutely in an axial direction of said table to impart fine movement to said table through a nut means (47) engaged with said screw shaft means, thus enabling an ultra-precision positioning of said table.

3. Means for locating an ultra-precision positioning of a table as claimed in claim 2, in which said piezoelectric element is disposed coaxially on an axis of said screw shaft means.

* * * * *